United States Patent
Vyssotski et al.

(10) Patent No.: US 8,117,172 B2
(45) Date of Patent: Feb. 14, 2012

(54) COMPACT ENCODING METHODS, MEDIA AND SYSTEMS

(75) Inventors: Nikolai Vyssotski, Austin, TX (US); John Hentosh, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 493 days.

(21) Appl. No.: 12/129,653

(22) Filed: May 29, 2008

(65) Prior Publication Data

US 2009/0300265 A1 Dec. 3, 2009

(51) Int. Cl.
*G06F 7/00* (2006.01)
*H04B 1/66* (2006.01)

(52) U.S. Cl. ........................ 707/693; 375/240

(58) Field of Classification Search ................. 386/109; 375/240; 707/693
See application file for complete search history.

(56) References Cited

U.S. PATENT DOCUMENTS

| | | | | |
|---|---|---|---|---|
| 4,305,063 A * | 12/1981 | Hanson | ........................... | 341/87 |
| 4,455,654 A * | 6/1984 | Bhaskar et al. | ................ | 714/28 |
| 4,949,200 A * | 8/1990 | Weng | ............................. | 360/48 |
| 5,042,001 A * | 8/1991 | Brightman et al. | ........... | 708/490 |
| 5,208,769 A * | 5/1993 | Mandava | ...................... | 708/655 |
| 5,550,566 A * | 8/1996 | Hodgson et al. | ............. | 345/547 |
| 6,000,006 A | 12/1999 | Bruce et al. | | |
| 2005/0188054 A1* | 8/2005 | Riihijarvi et al. | ............. | 709/218 |

* cited by examiner

*Primary Examiner* — Vincent Boccio
(74) *Attorney, Agent, or Firm* — Garrana Tran LLp; Andrea E. Tran

(57) ABSTRACT

A method for compact encoding including providing a first value field allocated in a first portion of a memory, wherein a portion of the first value field is utilized to store a fixed-size variable. A most significant zero bit (MSZB) is located in the first value field, and it is determined if the fixed-size variable can be written in a first area without performing an erase operation. The first area includes the N bits following the MSZB in the first value field. The fixed-size variable is written into the first area if the fixed-size variable can be written without performing the erase operation.

20 Claims, 2 Drawing Sheets

COMPACT ENCODING METHODS, MEDIA AND SYSTEMS

BACKGROUND

1. Technical Field

The present disclosure relates generally to the field of information handling systems. More specifically, but without limitation, the present disclosure relates to an encoding scheme.

2. Background Information

As the value and use of information continues to increase, individuals and businesses seek additional ways to process and store information. One option available to users is an information handling system. An information handling system (IHS) generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for such systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In an IHS, various data, including settings for the IHS, may be saved in a nonvolatile storage. Such settings, which may be rarely or frequently changed, may include information regarding hardware configuration, operating modes, boot options, operating system settings, or the like. Current nonvolatile storage technology may have a limit to the number of times a particular memory location may be rewritten before potential data corruption. For example, NAND flash devices may characteristically wear out after approximately 10,000 to 1,000,000 erase-write cycles and NOR flash memory may be limited to approximately 100,000 cycles.

NAND and NOR flash memories may have specific benefits when compared to each other. For example, a NAND flash memory may feature faster write and erase times, while a NOR flash memory may exhibit superior read speeds and random access capabilities. Additionally, one of the benefits of a NOR flash memory may be the ability to run a stored program without having to transfer the program to random access memory (RAM), which may be referred to as in-place execution of code. Because NOR flash memory may provide in-place execution of code, NOR flash memory may often be employed as storage for basic input/output system (BIOS) and ancillary firmware. As a result, settings for an IHS may be stored in the same portion of NOR flash memory employed by BIOS.

Thus a need remains for systems, methods, and computer-readable media for reducing wear in a flash memory. The systems, methods, and computer-readable media provide a compact encoding scheme to reduce wear caused by frequently changing fixed-sized values written in a [NOR] flash memory.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

One aspect of the disclosure provides a method for compact encoding including providing a first value field allocated in a first portion of a memory, wherein a portion of the first value field is utilized to store a fixed-size variable. A most significant zero bit (MSZB) is located in the first value field, and it is determined if the fixed-size variable can be written in a first area without performing an erase operation. The first area includes the N bits following the MSZB in the first value field. The fixed-size variable is written into the first area if the fixed-size variable can be written without performing the erase operation.

Another aspect of the disclosure provides a computer-readable medium having computer-executable instructions for performing a method for compact encoding. The method includes providing a first value field allocating a first portion of a memory, wherein a portion of the first value field is utilized to store a fixed-size variable, and locating a most significant zero bit (MSZB) in the first value field. Additionally, it is determined whether the fixed-size variable can be written in a first area without performing an erase operation, wherein the first area comprises N bits following the MSZB in the first value field. The fixed-size variable is written into the first area if the fixed-size variable can be written in the first area without performing the erase operation.

Yet another aspect of the disclosure provides a method for compact encoding for a flash memory. The method includes providing a first value field allocated in a first portion of the flash memory, wherein a portion of the first value field is utilized to store a fixed-size variable. Further, a most significant zero bit (MSZB) in the first value field is located, wherein the MSZB is the most significant bit in the first value field with a value of zero. A determination is made regarding whether the fixed-size variable can be written in a first area comprising N bits following the MSZB in the first value field without performing an erase operation, wherein the erase operation transitions a value of all the bits in the first value field to one. The fixed-size variable is written into the first area if the fixed-size variable can be written in the first area without performing the erase operation.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein.

DETAILED DESCRIPTION

Although the invention as been described with reference to specific implementations, it will be understood by those skilled in the art that various changes may be made without departing from the spirit or scope of the invention. Various examples of such changes have been given in the forgoing description. Accordingly, the disclosure of implementations of the disclosure is intended to be illustrative of the scope of the invention and is not intended to be limiting. It is intended that the scope of the invention shall be limited only to the extent required by the appended claims. For example, to one of ordinary skill in the art, it will be readily apparent that the information handling system discussed herein may be implemented in a variety of implementations, and that the forgoing discussion of certain of these implementations does not necessarily represent a complete description of all possible implementations.

For simplicity and clarity of illustration, the drawings and/or figures illustrate the general manner of construction, and descriptions and details of well known features and techniques may be omitted to avoid unnecessarily obscuring the disclosure.

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

Figure 1:
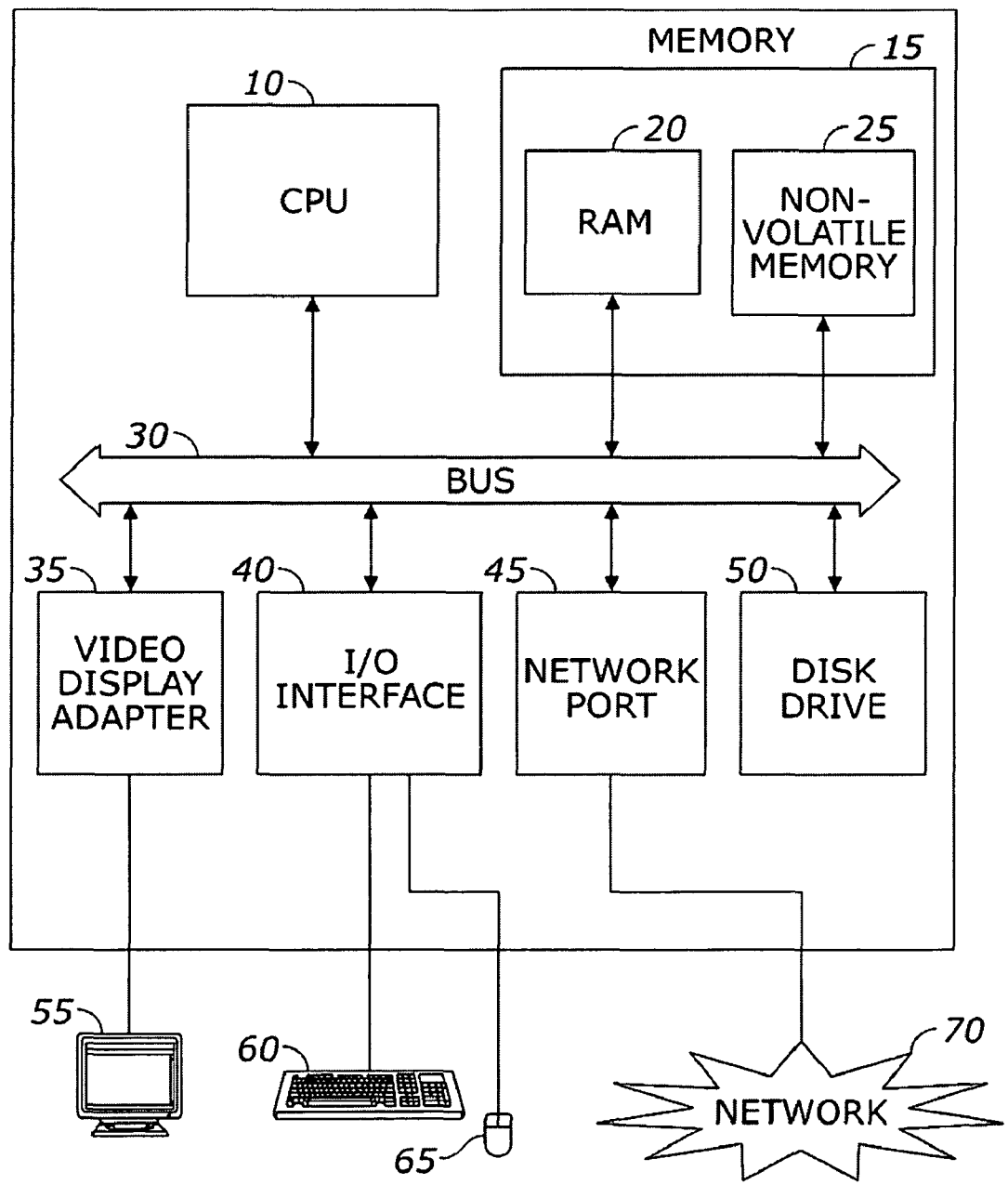
FIG. 1 provides a schematic of an information handling system according to the present disclosure.

FIG. 1 illustrates one possible implementation of an IHS 5 comprising a CPU 10. It should be understood that the present disclosure has applicability to information handling systems as broadly described above, and is not intended to be limited to the IHS 5 as specifically described. The CPU 10 may comprise a processor, a microprocessor, minicomputer, or any other suitable device, including combinations and/or a plurality thereof, for executing programmed instructions. The CPU 10 may be in data communication over a local interface bus 30 with components including memory 15 and input/output interfaces 40. The memory 15, as illustrated, may include non-volatile memory 25. The non-volatile memory 25 may include, but is not limited to, firmware flash memory and electrically erasable programmable read-only memory (EEPROM). The firmware program (not shown) may contain, programming and/or executable instructions required to control a keyboard 60, mouse 65, video display 55 and/or other input/output devices not shown here. The memory may also comprise RAM 20. The operating system and application programs may be loaded into the RAM 20 for execution.

The IHS 5 may be implemented with a network port 45 to permit communication over a network 70 such as a local area network (LAN) or a wide area network (WAN), such as the Internet. As understood by those skilled in the art, IHS 5 implementations may also include an assortment of ports and interfaces for different peripherals and components, such as video display adapters 35, disk drives port 50, and input/output interfaces 40 (e.g., keyboard 60, mouse 65).

In an IHS, one or more storage media, such as flash memory, may be present. When data is to be written to a flash memory, an erase operation may precede a write or rewrite operation. An erase operation may initialize all the bits within a sector or block to one. A write or rewrite operation may change a specified set of bits to zero, and can occur at a much smaller granularity such as a byte or bit. In a flash memory, a write operation may not allow a bit to be changed from zero to one. A block may need to be erased and rewritten to allow a bit to be changed from zero to one.

Due to the limitations on erase-write cycles, it may become desirable to rewrite to a location in a flash memory, without an intervening erase operation, to reduce memory wear. If a change in a value may be derived from the value currently stored in a memory by transitioning additional bits from one to zero, an intervening erase operating may no longer be needed. In the case of a NOR flash, multiple write operations which target the same location may not significantly contribute to wear in a memory device. Thus, one may reduce the wear in a NOR flash memory by writing data to the same location when possible, without performing an intervening erase operation.

A popular implementation of variable services in UEFI (Unified Extensible Firmware Interface) BIOS (basic input/output system) may devote a specific fixed-sized region of a flash memory to nonvolatile variables. The variables may represent key/value pairs that consist of identifying information, which may include attributes and arbitrary data utilized during variable services operations. Each variable may consist of three components such as a name, attribute, and value fields. A name field may store an identifier specifying a type of variable. An attribute field may contain data indicating how a data variable should be stored and maintained. A value field may provide an area for data representing the value of a variable to be stored. Several variables may be stored sequentially in the order written in the fixed-sized region as a variable pool. A variable pool may include several up-to-date variables to be utilized for variable services operations. When an existing variable requires a new value, a new copy of the variable may appear appended at the end of a variable pool and a bit may be cleared in the original variable's attribute field to indicate its deletion. Eventually, the variable pool may grow to fill the fixed-sized region, which may require compaction of the variable pool. During compaction, the entire fixed-sized region may be erased and the variable pool may be rebuilt utilizing a random access memory (RAM) cache storing the most recent version of each variable.

Using the current scheme employed in UEFI, each time a change in value occurs, a new variable may be appended to the end of the variable pool. However, by taking advantage of unused bits in a value field, the number of times a change in value results in addition of a variable to the variable pool may be reduced. In turn, this may delay compaction of the variable pool, and reduce the number of times the fixed-sized region undergoes erasure.

Consider frequently changing Boolean variables, which may be variables that receive a value of true or false represented by one or zero. A value field may provide a fixed-sized region in a portion of a memory such as a flash memory. A fixed-size variable is a variable that may be represented utilizing a set number of bits in a portion of a value field. Throughout the present disclosure, Z may be used to refer to the number of bits provided in a value field and N may be used to refer to the number of bits used by a fixed-size variable. For example, a value field may provide a one byte (Z equals 8) region (e.g., 11110100), and a fixed-size variable may utilize three bits (N equals 3) in a value field to represent the variable (e.g., "100"). In some cases, a value field may be erased and a fixed-size variable may be re-written in the value field each time the fixed-size variable is changed.

For purposes of illustration, assume a value field provides one byte (or 8 bits) and a fixed-size variable only requires one bit. In a wear-reducing encoding scheme, the most significant bit (MSB) with a value of zero in a value field may indicate that the following N bit(s) (i.e., less significant bits) contains a value representing a fixed-size variable. The value of N may represent the number of bits in a fixed-size variable. In some situations, a subsequent value may derive from its previous value by zeroing one or more bits without setting any bits to one through an erasing operation. For example, if the value field provides values of 11110100, the fourth bit (counting from the right) indicates that the following N bits represent the fixed-size variable. In the case that a fixed-size variable utilizes one bit or N is equal to one, then the fixed size variable may possess a value of "1".

In the example below, the eight transitions shown may be attained by utilizing only write operations, without the need for any intervening erase operations. In one possible implementation, when a bit having a value of one follows the most significant zero bit (MSZB), such as the most significant bit with a zero value, the fixed-size variable may indicate "true", and when a bit following the MSZB has a value of zero, then the fixed-size bit may indicate "false".

By way of example only, the potential multiple transitions may occur as follows:
Transition 1—11111101—true
Transition 2—11111100—false
Transition 3—11110100—true
Transition 4—11110000—false
Transition 5—11010000—true
Transition 6—11000000—false
Transition 7—01000000—true
Transition 8—00000000—false This encoding scheme may reduce flash memory wear by decreasing the number of erase operations induced by frequently changing variables with a small fixed-sized value and by delaying the allocation of a new value field until a transition can no longer be made in the current value field. In the example above, eight transitions may be made before a new value field is allocated. As shown, one-byte long value fields are provided for illustrative purposes only. However, it is understood that an IHS may utilize a larger or smaller sized value field such as a word, a double word, a nibble, or any other suitable number of bits. Additionally, an implementation of a fixed-size variable may provide any suitable number of bits, and not just one bit as shown in the prior example.

In another illustrative implementation, a one byte value field and a two-bit fixed-size variable may be provided. A two-bit fixed-size variable may be utilized to provide four values such as A=11, B=10, C=01, and D=00. By way of example only, multiple transitions may occur as follows:
Transition 1—11111011—A
Transition 2—11111010—B or 11111001—C
Transition 3—11111000—D
Transition 4—11011000—A
Transition 5—11010000—B or 11001000—C
Transition 6—11000000—D As in the previous example, the most significant zero bit (MSZB) may indicate the location of a fixed-size variable. Since the fixed-size variable is two-bits long, the two bits following the MSZB may provide the value of the fixed-size variable. In transitions 2 and 5, there may be two potential options. A fixed-size variable may transition from a value of A to a value of B or C. However, a value of B cannot transition to a value of C or vice versa. Value B may be represented by bit values of 10, and value C may be represented by bit values of 01. Since a bit value of 0 may not be transitioned to 1 without an erase operation, a transition from value B to C or vice versa may be omitted. It is understood that in other implementations utilizing a multi-bit, fixed-size variable, it may be necessary to omit a transition from one value to another value in order to avoid an erase operation.

Figure 2:
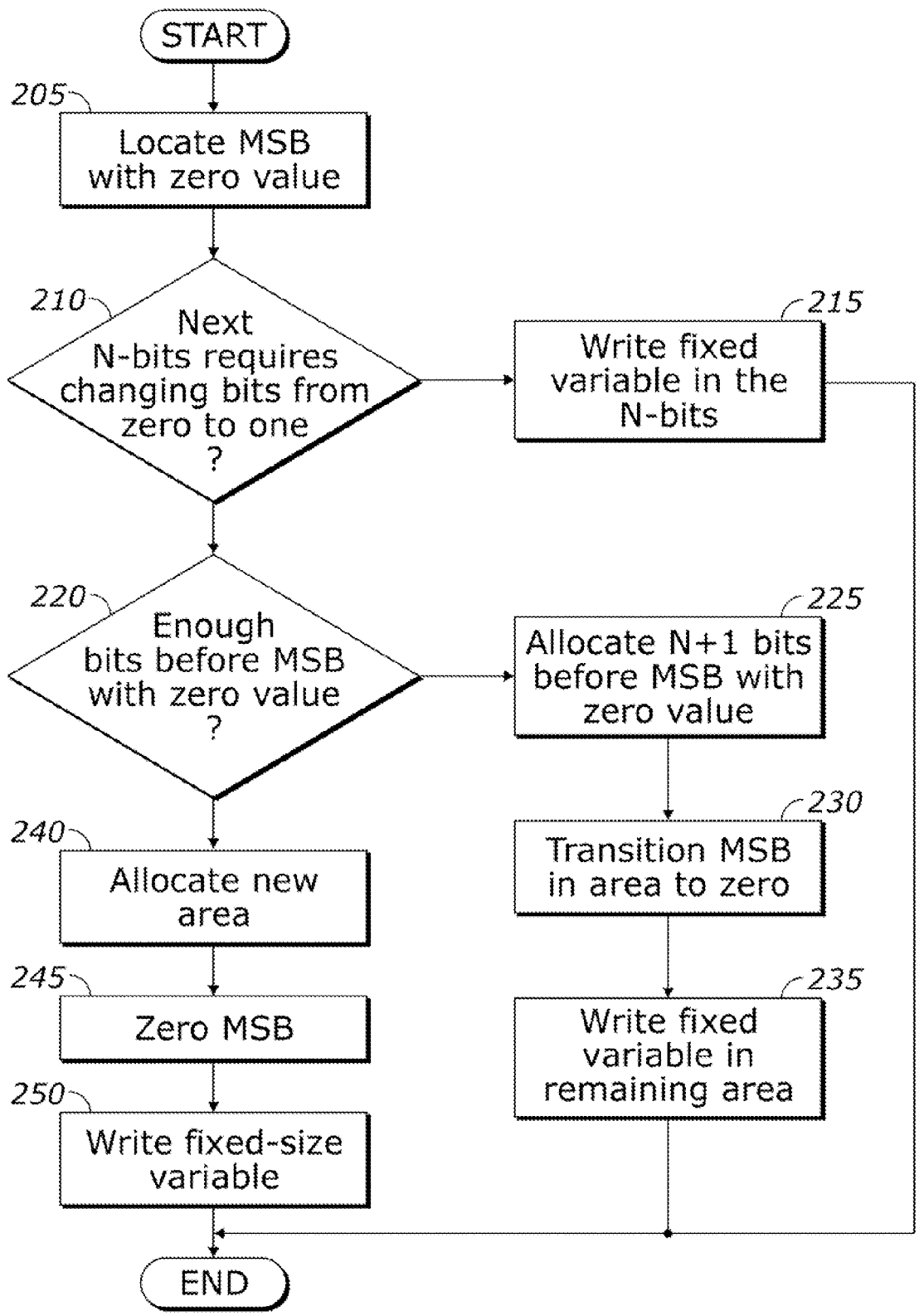
FIG. 2 provides an illustrative implementation of a wear-reducing encoding method.

FIG. 2 provides an illustrative implementation of a wear-reducing encoding method. The illustration provides a general method of encoding that may be applied to value fields and fixed-size variables of any suitable size. Various methods are contemplated including all or less than all of the steps described herein and/or mentioned below, any number of repeats, and performance of the steps in any order.

A value for a fixed-size variable may be written to a portion of a value field. When a change in a value of a fixed-size variable occurs, the wear-reducing encoding method may be performed to preserve the lifespan of the memory. When possible, the wear reducing encoding method may write changes in the fixed-size variable in the same value field instead of allocating a new value field. In the following discussion, a value field of one byte and a fixed-size variable of two bits may be discussed for illustrative purposes. However, the general method of encoding discussed below may be implemented utilizing value fields and fixed-size variables of any suitable size(s). Each time there is a change in the value of a fixed-size variable, the following steps in the wear-reducing encoding method may be performed. In step 205, a most significant zero bit (MSZB) or a most significant bit (MSB) with a value of zero may be located in the value field. The N bits following (less significant bits) a MSZB in the value field may represent a fixed-size variable. The value of N may be determined by the number of bits in a fixed-size variable. For example, if a value field contains a byte with values 11111001, the third bit (counting from the right) or the MSZB indicates that the following N bits represent a fixed-size variable. Since the present illustration assumes a two-bit fixed-size variable, N is equal to two and "01" represents the fixed-size variable.

The N bits following the MSZB may be evaluated to determine if any of the bits require a transition from 0 to 1 in order to represent a change in the fixed-size variable in step 210. Since a write operation may not be able to transition a bit from 0 to 1 without an erase operation, the N bits following the MSZB may only be utilized without an erase operation if none of the bits requires a transition from 0 to 1. For example, the value of the fixed-size variable is currently "01", which may be changed to "00" with a write operation. However, a change to values of "10" or "11" for the fixed-size variable may require the transition of a bit from 0 to 1. When the N bits do not require any transition from 0 to 1, the change in the fixed-size variable may be written in the N bits by transitioning bit(s) from 1 to 0 as necessary in step 215. For example, changing the value of the fixed sized variable from "01" to "00" may only require the last bit to be transitioned to a zero value.

If any of the N bits following the MSZB must be transitioned from 0 to 1, then a new area may be allocated for the fixed-size variable. In step 220, the bits before (i.e., more significant bits) the MSZB in a value field may be counted to determine if there are enough bits to write the fixed-size variable. Since the fixed-size variable may be N bits long and one additional bit is required to indicate the location of the fixed size variable, there must be at least N+1 bits before the MSZB in the value field. For example, if the fixed-size variable's value changes to "10" or "11", then bits before the MSZB in the value field (i.e., 11111010) may be counted to determine if there are N+1 bits available. In the case that N+1 bits are available before the MSZB, the N+1 bits before the MSZB are allocated for the fixed-size variable in step 225. In step 230, the MSB of the allocated N+1 bits may be transitioned to zero to indicate the location of a new value for the fixed-size variable, and the MSB then becomes the new MSZB in the value field. Next, the remaining N bits may be written to indicate the new value of the fixed-size variable in step 235. In one possible example, 2+1 bits may be needed and five bits may be available in the value field. In order to store the change in value of the fixed-size variable, the sixth bit (counting from the right) in the value field may be changed to zero and the fixed-size variable may be written in the following two bits. Assuming the value changes to "11", the value field may now have a value of 11011010.

If there are not enough bits before the MSZB, a new area may be allocated in step 240. A new area may be allocated in a fixed-sized region of a memory by creating a new variable including a name, an attribute, and a value field. In another implementation, a new area may be created by erasing the original value field or changing all of the bits in the value field to 1. The least significant N+1 bits in the new area are allocated for the change in the fixed-size variable. The MSB in the new area may be changed to 0 to indicate the location of the fixed-size variable in step 245. In step 250, the fixed-size variable may be written to the remaining bits in the allocated area. For example, if a first value field's current value is 11000000, the current value of the fixed-size variable is "00". If the fixed-size variable changes to "11", there may only be two bits before the MSZB when three bits (i.e., N+1=2+1) may be needed to represent the change in the fixed-size variable. When a new area is allocated (i.e., second value field—11111111), the least significant N+1 bits may be allocated. The MSB in the allocated area may be changed to 0 (i.e., 11111011), and a write operation may be performed on the following two bits if needed. In some cases, such as in the present example, the bits following a MSB may not need to be changed to represent the fixed-size variable. A compact encoding scheme may encode data in a manner that efficiently utilizes an allocated area for the data. By utilizing a compact encoding scheme, the number of erase/write operations may be reduced which reduces the amount of wear on a nonvolatile flash memory.

Methods of the present disclosure, detailed description and claims may be presented in terms of logic, software or software implemented aspects typically encoded on a variety of media or medium including, but not limited to, computer-readable medium/media, machine-readable medium/media, program storage medium/media or computer program product. Such media may be handled, read, sensed and/or interpreted by an IHS. Those skilled in the art will appreciate that such media may take various forms such as cards, tapes, magnetic disks (e.g., floppy disk or hard drive) and optical disks (e.g., compact disk read only memory ("CD-ROM") or digital versatile disc ("DVD")). It should be understood that the given implementations are illustrative only and shall not limit the present disclosure.

The present disclosure is to be taken as illustrative rather than as limiting the scope or nature of the claims below. Numerous modifications and variations will become apparent to those skilled in the art after studying the disclosure, including use of equivalent functional and/or structural substitutes for elements described herein, and/or use of equivalent functional junctions for couplings/links described herein.

What is claimed is:

1. A method for compact encoding in a memory subject to wear from erase operations, the method comprising:

providing a first value field allocated in a first portion of a memory, wherein a portion of the first value field is utilized to store a fixed-size variable value;

locating a most significant zero bit (MSZB) of a previously stored fixed-size variable value in a first area of the first value field;

counting the bits before the MSZB in a value field;

determining if there are enough bits to write a new fixed-size variable value in the first area of the value field; and if there are enough bits, allocating those bits for the fixed-size variable and transitioning the first most significant bit (MSB) of the allocated bits to zero;

writing the new fixed-size variable value into the first area of the value field without performing an erase operation; and if there are not enough bits, allocating a new area in the memory to change the MSB in the new area to zero.

2. The method of claim 1, wherein N represents a total number of bits in the fixed-size variable.

3. The method of claim 2, further comprising:

determining if the fixed-size variable can be written in a second area defined by bits before the MSZB in the first value field if the fixed-size variable cannot be written in the first area, wherein N+1 bits are required in the second area for the fixed-size variable to be written; and allocating a first set of bits comprising N+1 bits in the first value field before the MSZB if the fixed-size variable can be written in the second area, wherein a first most significant bit (MSB) of the first set of bits is transitioned to zero and the fixed-size variable is written in the remaining bits in the first set of bits.

4. The method of claim 3 further comprising:

allocating a second portion of the memory for a second value field containing Z bits if the fixed-size variable cannot be written in the second area, wherein a second set of bits comprising N+1 of the least significant bits in the second value field is utilized to store the fixed-size variable;

transitioning a second MSB of the second set of bits to zero, wherein the fixed-size variable is written in the remaining bits of the second set of bits.

5. The method of claim 4, wherein the Z represents a total number of bits in the first value field.

6. The method of claim 4, wherein the second portion of the memory comprises a second variable, the second variable comprising a name field, an attribute field, the second value field, or a combination thereof.

7. The method of claim 1, wherein the fixed-size variable is a unified extensible firmware interface (UEFI) variable.

8. A computer-readable medium having computer-executable instructions for performing a method for compact encoding in a memory subject to wear from erase operations, the method comprising:

providing a first value field allocating a first portion of a memory, wherein a portion of the first value field is utilized to store a fixed-size variable;

locating a most significant zero bit (MSZB) of a previously stored fixed-size variable value in a first area of the first value field;

counting the bits before the MSZB in a value field;

determining if there are enough bits to write-a new fixed-size variable value; and if there are enough bits, allocating those bits for the fixed-size variable and transitioning the first most significant bit (MSB) of the allocated bits to zero;

writing the new fixed-size variable value into the first area of the value field without performing an erase operation; and if there are not enough bits, allocating a new area in the memory to change the MSB in the new area to zero.

9. The computer-readable medium of claim 8, wherein N represents a total number of bits in the fixed-size variable.

10. The computer-readable medium of claim 9, wherein the method further comprises:

determining if a fixed-size variable can be written in a second area defined by bits before the MSZB in the first value field if the fixed-size variable cannot be written in the first area, wherein N+1 bits are required in the second area for the fixed-size variable to be written; and allocating a first set of bits comprising N+1 bits before the MSZB in the first value field if the fixed-size variable can be written in the second area, wherein a first most significant bit (MSB) of the first set of bits is transitioned to zero and the fixed-size variable is written in the remaining bits in the first set of bits.

11. The computer-readable medium of claim 10, wherein the method further comprises:

allocating a second portion of the memory for a second value field containing Z bits if the fixed-size variable cannot be written in the second area, wherein a second set of bits comprising N+1 of the least significant bits in the second value field is utilized to store the fixed-size variable;

transitioning a second MSB of the second set of bits to zero, wherein the fixed-size variable is written in the remaining bits of the second set of bits.

12. The computer-readable medium of claim 11, wherein the Z represents a total number of bits in the first value field.

13. The computer-readable medium of claim 11, wherein the second portion of the memory comprises a second variable, the second variable comprising a name field, an attribute field, the second value field, or a combination thereof.

14. The computer-readable medium of claim 8, wherein the fixed-size variable is a unified extensible firmware interface (UEFI) variable.

15. A method for encoding a flash memory subject to wear from erase operations, the method comprising:

providing a first value field allocated in a first portion of the flash memory, wherein a portion of the first value field is utilized to store a variable value;

locating a most significant zero bit (MSZB) of a previously stored variable value in a first area of the first value field;

determining if there are enough bits to write a new fixed-size variable value; and if there are enough bits, allocating those bits for the fixed-size variable and transitioning the first most significant bit (MSB) of the allocated bits to zero;

writing the new fixed-size variable value into the first area of the value field without performing an erase operation; and if there are not enough bits, allocating a new area in the memory and changing the MSB in the new area to zero.

16. The method of claim 15, wherein N represents a total number of bits in the variable.

17. The method of claim 15 further comprising:

determining if the variable can be written in a second area defined by bits before the MSZB in the first value field if the variable cannot be written in the first area, wherein N+1 bits are required in the second area for the variable to be written; and allocating a first set of bits comprising N+1 bits in the first value field before the MSZB if the variable can be written in the second area, wherein a first most significant bit (MSB) of the first set of bits is transitioned to zero and the fixed-size variable is written in the remaining bits in the first set of bits.

18. The method of claim 15 further comprising:

allocating a second portion of the flash memory for a second value field if the variable cannot be written in the second area, wherein a second set of bits comprising N+1 of the least significant bits in the second value field is utilized to store the variable;

transitioning a second MSB of the second set of bits to zero, wherein the variable is written in the remaining bits of the second set of bits.

19. The method of claim 18, wherein the second portion of the flash memory comprises a second variable, the second variable comprising a name field, an attribute field, the second value field, or a combination thereof.

20. The method of claim 15, wherein the variable is a unified extensible firmware interface (UEFI).

* * * * *